United States Patent
Chu (12)

(10) Patent No.: US 6,180,493 B1
(45) Date of Patent: Jan. 30, 2001

(54) METHOD FOR FORMING SHALLOW TRENCH ISOLATION REGION

(75) Inventor: Chih-Hsun Chu, Hsinchu (TW)

(73) Assignee: United Silicon Incorporated, Hsinchu (TW)

(*) Notice: Under 35 U.S.C. 154(b), the term of this patent shall be extended for 0 days.

(21) Appl. No.: 09/241,739

(22) Filed: Feb. 1, 1999

(30) Foreign Application Priority Data

Oct. 21, 1998 (TW) .................................................. 87117419

(51) Int. Cl.$^7$ .................................................. H01L 21/762
(52) U.S. Cl. .................................................. 438/437
(58) Field of Search .................................. 438/424, 437, 438/702, FOR 227

(56) References Cited

U.S. PATENT DOCUMENTS

| 5,340,769 | * | 8/1994 | Miyamoto . |
| 5,496,765 | * | 3/1996 | Schwalke . |
| 5,719,085 | * | 2/1998 | Moon et al. . |
| 5,940,717 | * | 8/1999 | Rengarajan et al. . |
| 6,033,970 | * | 3/2000 | Park . |

* cited by examiner

Primary Examiner—George Fourson
(74) Attorney, Agent, or Firm—Jiawei Huang; J.C. Patents

(57) ABSTRACT

A method for forming shallow trench isolation region. The method includes the steps of forming spacers on the sidewalls of a patterned mask layer and a pad oxide layer, and then etching the substrate to form a trench using the mask layer and the spacers as a mask. Thereafter, a buffer layer conformal to the surface profile of the device is formed over the substrate, and then an insulation layer is formed inside the trench. The spacers can prevent the etching of the insulation layer to form recess cavities at the upper corners of the trench when the pad oxide layer is removed in an etching operation. Hence, the kink effect is prevented. The buffer layer can prevent the oxidation of trench sidewalls when the insulation layer is densified in an oxygen-filled atmosphere. Moreover, the buffer layer can also prevent sideways etching of the insulation layer when the pad oxide layer is etched.

27 Claims, 8 Drawing Sheets

METHOD FOR FORMING SHALLOW TRENCH ISOLATION REGION

CROSS-REFERENCE TO RELATED APPLICATION

This application claims the priority benefit of Taiwan application serial no. 87117419, filed Oct. 21, 1998.

BACKGROUND OF THE INVENTION

1. Field of Invention

The present invention relates to a method for forming an integrated circuit device. More particularly, the present invention relates to a method for forming a shallow trench isolation (STI) region in a semiconductor substrate.

2. Description of Related Art

Device isolation regions are specially formed structures in a substrate for preventing carriers from moving between neighboring devices. Normally, device isolation regions are formed within a dense semiconductor circuit, for example, between the field effect transistors (FETs) inside a dynamic random access memory (DRAM) for reducing leakage current between the FETs. Conventional isolation regions are a pattern of field oxide layers formed using a local oxidation of silicon (LOCOS) method. Since the LOCOS method has been in use for fabricating devices some time, it has become one of the most cost effective and reliable methods for forming device isolation regions.

However, the field oxide layer produced by the LOCOS method often builds up internal stress. Moreover, a bird's beak profile is formed close to the edge of the field oxide layer. The presence of a bird's beak near the edge of the field oxide layer makes device isolation almost impossible especially when the dimensions of device are small. Hence, in the fabrication of high-density circuits, shallow trench isolation (STI) type of isolation structure has to be used almost exclusively.

Shallow trench isolation is a method for forming a device isolation region. The method includes the steps of anisotropically etching a semiconductor substrate to form a trench, and then depositing oxide material to fill the trench. Since the shallow trench isolation structure can be scaled and the bird's beak encroachment problem can be avoided, STI is an ideal method for isolating sub-micron complementary MOS (CMOS) devices.

Figure 1A:
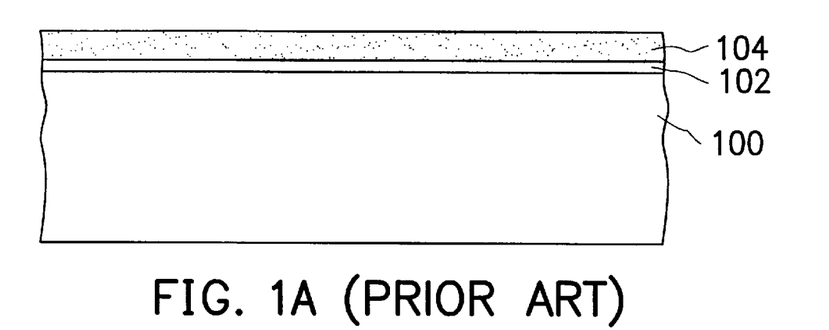
FIGS. 1A through 1E are schematic, cross-sectional views showing the progression of manufacturing steps according to a conventional method of forming a shallow trench isolation region in a substrate.

FIGS. 1A through 1E are schematic, cross-sectional views showing the progression of manufacturing steps according to a conventional method of forming a shallow trench isolation region in a substrate. First, as shown in FIG. 1A, a pad oxide layer 102 is formed over a silicon substrate 100 using a thermal oxidation method. The pad oxide layer 102 protects the silicon substrate 100 against damages in subsequent processing operations. Thereafter, a silicon nitride mask layer 104 is formed over the pad oxide layer 102 using a low-pressure chemical vapor deposition (LPCVD) method.

Figure 1B:
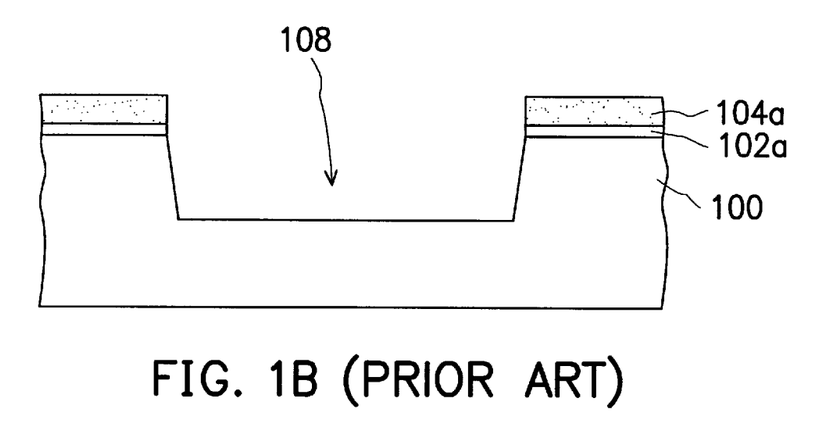

Next, as shown in FIG. 1B, a conventional method is used to deposit a photoresist layer (not shown) over the mask layer 104. Then, the mask layer 104, the pad oxide layer 102 and the silicon substrate 100 are sequentially etched. Hence, a patterned mask layer 104a and pad oxide layer 102a as well as a trench 108 are formed above the substrate 100. Finally, the photoresist layer is removed.

Figure 1C:
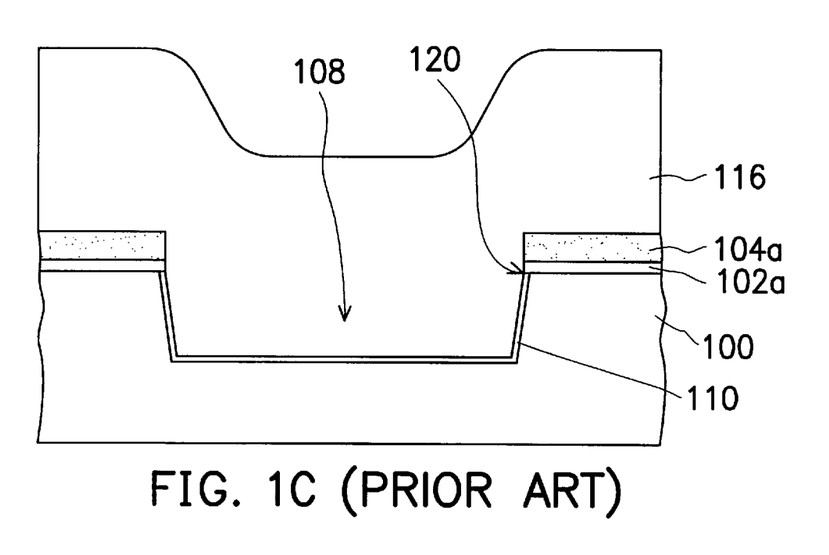

Next, as shown in FIG. 1C, high-temperature thermal oxidation is conducted to form a liner oxide layer 110 on the exposed substrate surface of the trench 108. The liner oxide layer 110 extends from the bottom of the trench 108 to the top corners 120 where it contacts the pad oxide layer 102a. Thereafter, insulating material is deposited into the trench 106 and over the silicon nitride layer 104a to form an insulation layer 116. The insulation layer 116 can be a silicon oxide layer formed using, for example, an atmospheric pressure chemical vapor deposition (APCVD) method. Subsequently, the substrate 100 is heated to a high temperature so that the silicon oxide material is allowed to densify into a compact insulation layer 116.

Figure 1D:
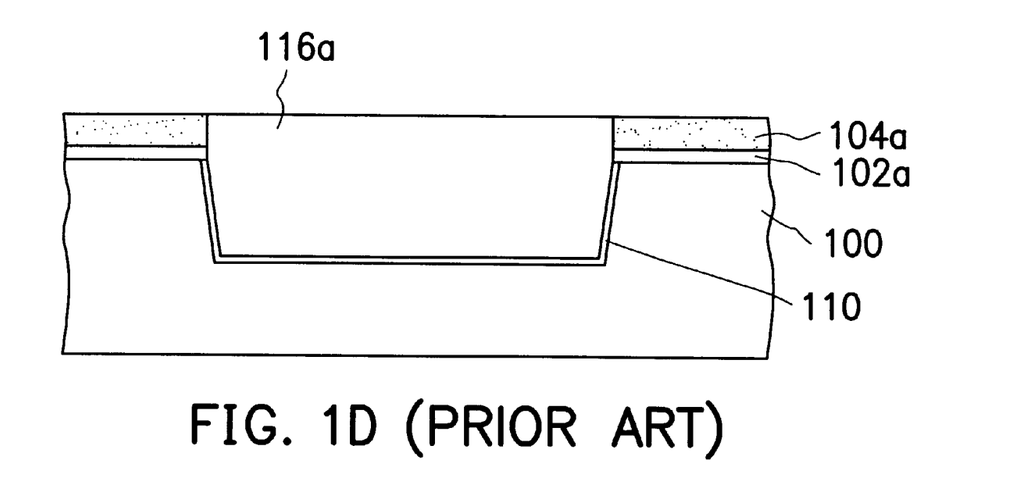

Thereafter, as shown in FIG. 1D, using the silicon nitride layer 104a as a polishing stop layer, chemical-mechanical polishing is carried out to remove a portion of the insulation layer 116 while retaining a portion within the trench 108. The remaining insulating material inside the trench 108 becomes an insulation layer 116a.

Figure 1E:
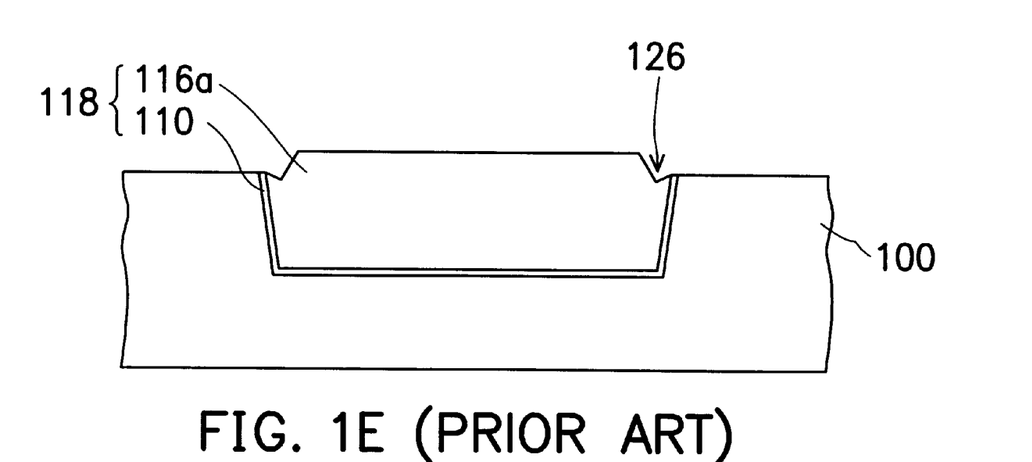

Next, as shown in FIG. 1E, hot phosphoric acid solution is applied to remove the silicon nitride mask layer 104a, thereby exposing the pad oxide layer 102a. Thereafter, hydrofluoric (HF) acid solution is applied to remove the pad oxide layer 102a. The remaining insulation layer 116a and liner oxide layer 110 within the trench 108 of the substrate 100 forms a complete device isolation region 118.

In the aforementioned method of fabricating a device isolation region, the densification of insulation layer 116 is carried out in a nitrogen-filled atmosphere rather than an oxygen-filled atmosphere. This is because the trench sidewalls may oxidize in an oxygen-filled atmosphere, which may lead to an accumulation of stress in that area. Obviously, high stress in the device is highly undesirable because it can produce unwanted leakage current and reliability problems. Nevertheless, by carrying out the densification in a nitrogen-filled atmosphere, the densified insulation layer 116 is less compact. Therefore, when hydrofluoric acid solution is applied to remove the pad oxide layer 102a in a wet etching operation, etching rate of the insulation layer 116 may be higher than the pad oxide layer 102a. Hence, the combination of the wet etching of pad oxide layer 102a with the isotropic etching of the insulation layer 116 easily produces recess cavities 126 at the top corners 120 of the trench 108 (that is, at the junction between the insulation layer 116 and the substrate 100). The recess cavities 126 in that region can lead to intensification of the kink effect. Consequently, besides lowering the threshold voltage, parasitic MOSFETs are also established around the corners of the device. Hence, a large leakage current may be produced.

In light of the foregoing, there is a need to improve the method of forming shallow trench isolation region.

SUMMARY OF THE INVENTION

Accordingly, the present invention provides a method for forming a shallow trench isolation region capable of densifying the insulation layer within the shallow trench such that recess cavities cannot form near the top corners of a trench. Hence, the conventional kink effect can be avoided and efficiency of the device can be improved.

To achieve these and other advantages and in accordance with the purpose of the invention, as embodied and broadly described herein, the invention provides a method for forming a shallow trench isolation (STI) region. The method includes the steps of sequentially forming a pad oxide layer and a mask layer over a substrate, and then patterning the pad oxide layer and the mask layer to form an opening. The substrate is etched to form a trench using the mask layer as an etching mask. A thermal oxidation process is carried out to form a first liner layer over the exposed substrate surface inside the trench. A second liner layer and a buffer layer, both conformal to the device profile, are sequentially formed over the substrate. A first insulation layer is formed inside the trench with the opening such that its upper surface is at a height level between the upper and the lower surface of the mask layer. A portion of the buffer layer lying above the second liner layer is removed so that the upper ends of the buffer layer are also at a level between the upper surface and the lower surface of the mask layer. A second insulation layer is formed over the first insulation layer, thereby filling the opening. The second liner layer, the mask layer and the pad oxide layer above the substrate are removed.

According to a second embodiment of this invention, a method for forming shallow trench isolation (STI) region is provided. The method includes the steps of sequentially forming a pad oxide layer and a mask layer over a substrate, and then patterning the pad oxide layer and the mask layer to form an opening. Spacers are formed on the exposed sidewalls of the mask layer and the pad oxide layer. The substrate is etched to form a trench using the mask layer and the spacers as an etching mask. A thermal oxidation process is conducted to form a liner layer over the exposed substrate surface of the trench. A buffer layer conformal to the device profile is formed. After that, a first insulation layer is formed within the trench and the opening such that its upper surface is at a height level between the upper and the lower surface of the mask layer. Then, a portion of the buffer layer lying above the liner layer is removed so that the upper end of the buffer layer is also at a level between the upper surface and the lower surface of the mask layer. A second insulation layer is formed over the first insulation layer, thereby filling the opening. The mask layer, the pad oxide layer and a portion of the spacers above the substrate are removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2G are schematic, cross-sectional views showing the progression of manufacturing steps for forming shallow trench isolation region in a substrate according to a first embodiment of this invention.

Figure 2A:
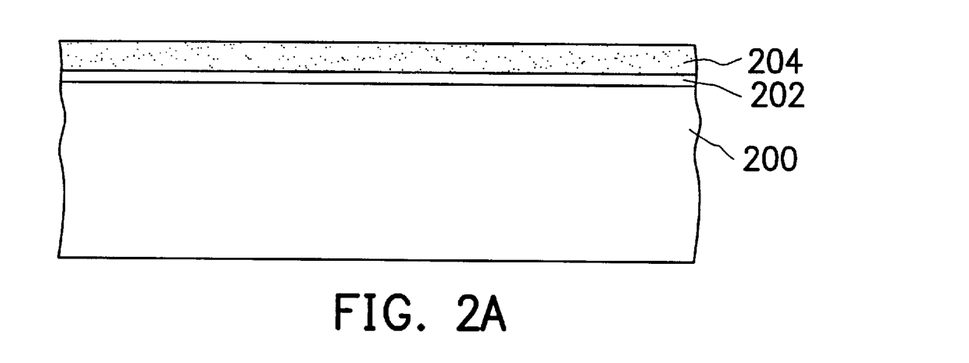
FIGS. 2A through 2G are schematic, cross-sectional views showing the progression of manufacturing steps for forming shallow trench isolation region in a substrate according to a first embodiment of this invention.

As shown in FIG. 2A, a pad oxide layer 202 is formed over a substrate 200, for example, a P-type silicon substrate. The pad oxide layer 202 can be formed using a thermal oxidation method. The pad oxide layer 202 protects the substrate against damages while subsequent processing operations are carried out. A mask layer 204 is formed over the pad oxide layer 202. The mask layer 204 is formed from a material having an etching rate that differs from the substrate 200. When the substrate 200 is a silicon layer, the mask layer 204 is preferably a silicon nitride layer formed using a chemical vapor deposition (CVD) method.

Figure 2B:
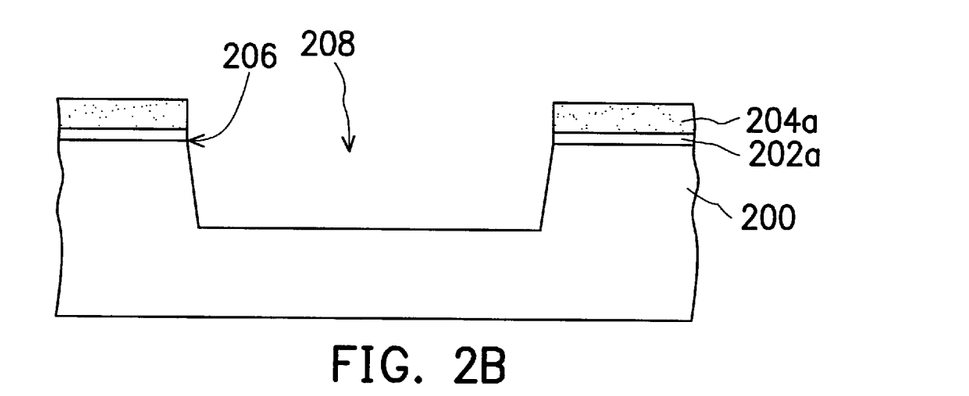

As shown in FIG. 2B, the mask layer 204 and the pad oxide layer 202 are patterned to form a mask layer 204a and a pad oxide layer 202a having an opening 206. Thereafter, using the mask layer 204a as a hard mask, the silicon is etched to form a trench 208. The method of patterning the mask layer 204 and the pad oxide layer 202 includes forming a patterned photoresist layer (not shown) over the mask layer 204. Then, the mask layer 204 and the pad oxide layer 202 are sequentially etched to form the opening 206. Subsequently, the photoresist layer is removed. Using the mask layer 204a as a hard mask, the substrate 200 is etched using an anisotropic etching method such as dry etching to form a trench 208.

Figure 2C:
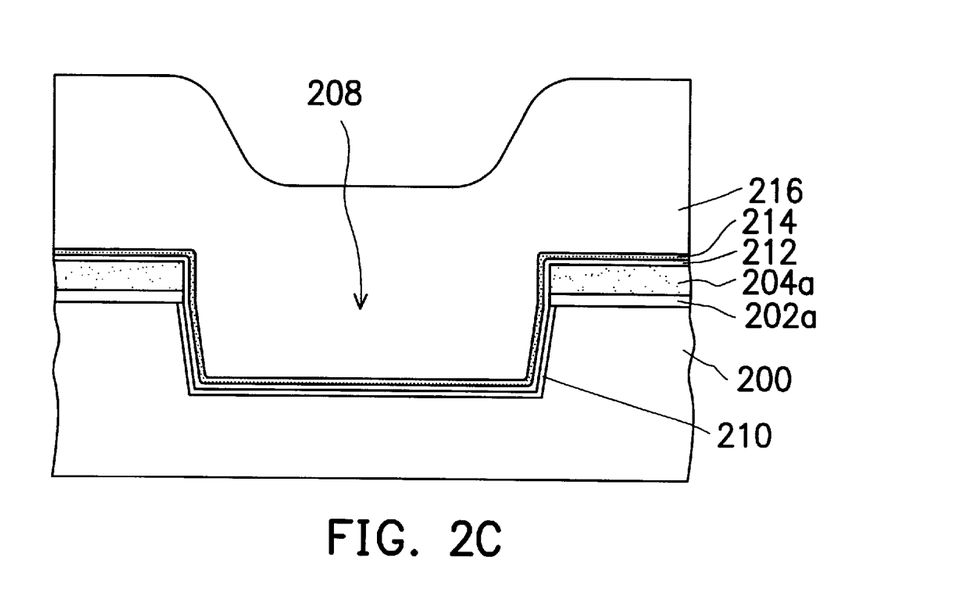

As shown in FIG. 2C, an oxidation process is carried out to form a first liner layer 210 over the exposed substrate surface inside the trench 208. A second liner layer 212 and a buffer layer 214, both conformal to the device profile, are formed over the substrate. A first insulating layer 216 that fills the trench 208 and the opening 206 is formed over the buffer layer 214. Normally, the oxidation process is carried out in an oxygen-filled atmosphere at a high temperature to form the first liner layer 210 over the exposed interior surface of the trench 208.

The second liner layer 212 is formed using a chemical vapor deposition (CVD) method. For example, using tetra-ethyl-ortho-silicate (TEOS) as a gaseous reactant, an atmospheric pressure chemical vapor deposition (APCVD) operation is conducted to form the TEOS silicon oxide liner layer 212. The buffer layer 214 is formed from a material having an oxidation rate that lower than the first insulation layer 216 and the pad oxide layer 202a. Thus, the buffer layer 214 is capable of preventing oxidation on the sidewalls of the trench 208 when densification of the first insulation layer 216 is carried out.

The buffer layer 214 has a lower etching rate, which is capable of preventing the conventional kink effect caused due to the sideways etching of the first insulation layer 216 in subsequent operation. The first insulation layer 216 can be a TEOS silicon oxide layer formed using TEOS as a gaseous reactant in an atmospheric pressure chemical vapor deposition (APCVD) operation.

Figure 2D:
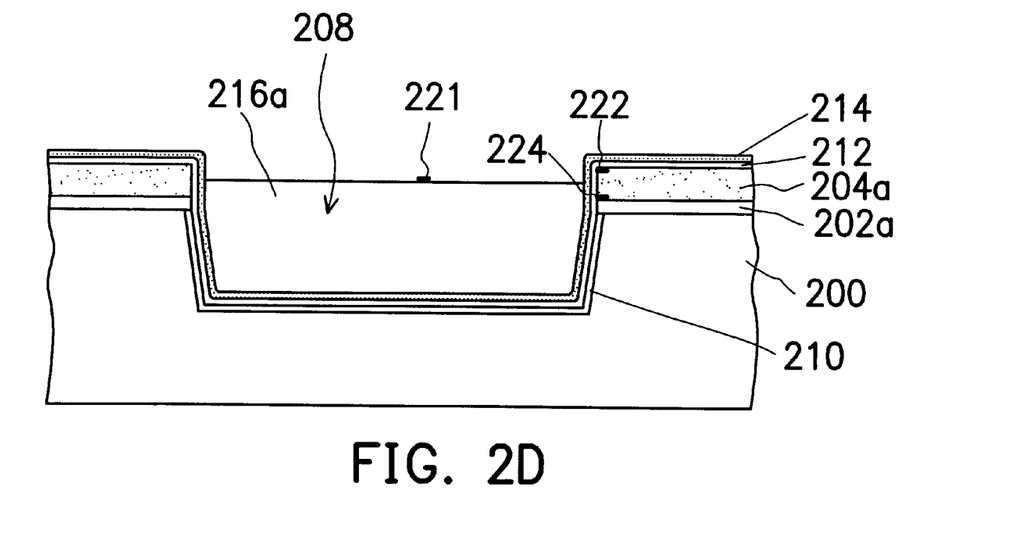

As shown in FIG. 2D, a portion of the first insulation layer 216 is removed to form an insulation layer 216a within the opening 206 (FIG. 2B) and the trench 208. The upper surface 221 of the insulation layer 216a is at a level between the upper surface 222 and the lower surface 224 of the mask layer 204a. The insulation layer 216a is formed, for example, by first performing a chemical-mechanical polishing operation to remove the first insulation layer 216 above the buffer layer 214 using the buffer layer 214 as a polishing stop layer. Then, the first insulation layer 216 is further etched back so that its upper surface 221 is at a level between the upper surface 222 and the lower surface 224 of the mask layer 204a.

As shown in FIG. 2B, using the second liner layer 212 as an etching stop layer, the exposed buffer layer 224 is removed. Ultimately, the upper end of the remaining buffer layer 214a is at a level between the upper surface 222 and the lower surface 224 of the mask layer 204a. Thereafter, a second insulation layer 228 is formed over the substrate 200 and covers the second liner layer 212 and the insulation layer 216a. The method of removing the buffer layer 214 includes using an isotropic etching operation such as a wet etching method.

Figure 2E:
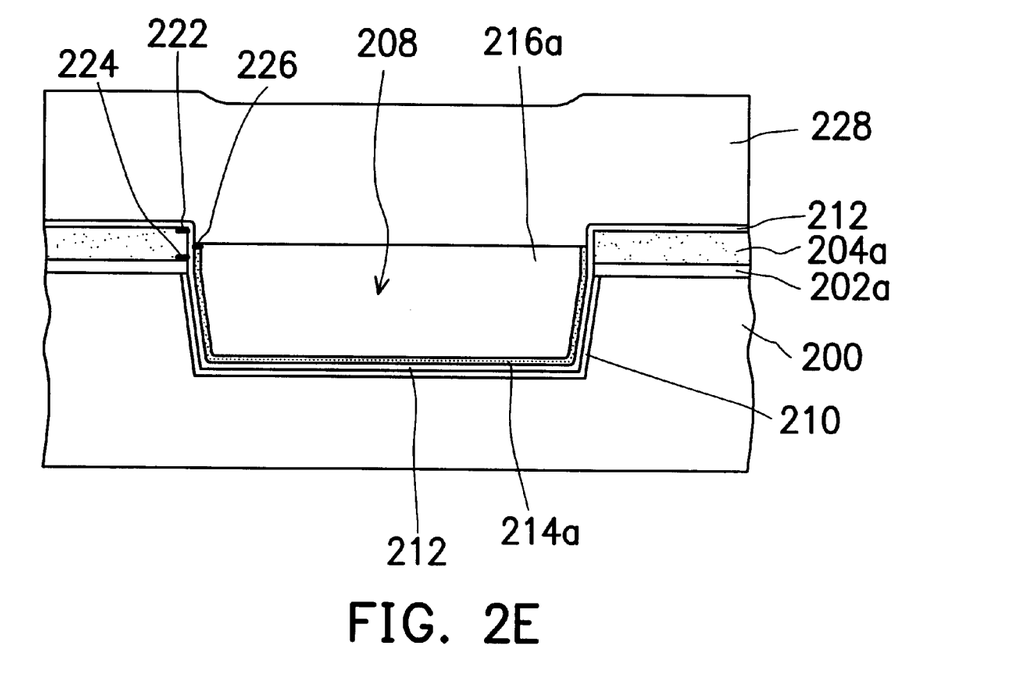

If the buffer layer 214 is a silicon nitride layer, hot phosphoric acid solution is preferably used as an etchant in the wet etching operation. The second insulation layer 228 is preferably a TEOS silicon oxide layer formed using TEOS as a gaseous reactant in an atmospheric chemical vapor deposition (APCVD) operation. It is preferable to densify the first insulation layer 216a and the second insulation layer 228. The insulation layers 216a and 228 can be densified by placing the substrate 200 in an oxygen-filled chamber and then heating to a temperature of about 1000° C. for about 10 to 30 minutes.

Since an insulation layer densified in an oxygen-filled atmosphere is much denser than one densified in a nitrogen-filled atmosphere, the degree of isolation produced by these insulation layers 216a and 228 inside the isolating structure is better. In addition, the buffer layer 214a between the substrate 200 and the insulation layer 216a can prevent the diffusion of oxygen during densification, and hence oxidation of the trench 208 sidewalls is avoided.

Figure 2F:
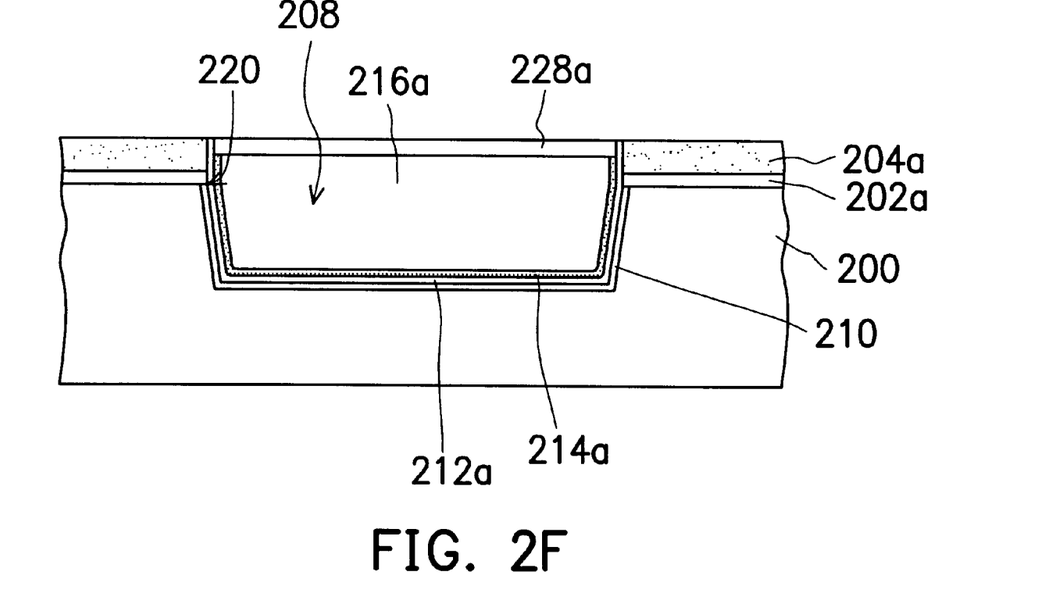

As shown in FIG. 2F, a portion of the second insulation layer 228 and the second liner layer 212 are removed. The remaining second insulation layer 228 forms an insulation layer 228a that covers the insulation layer 216a and fills the opening 206. The method of forming the insulation layer 228a includes performing a chemical-mechanical polishing operation using the mask layer 204a as a polishing stop layer. Therefore, the second liner layer 212 above the mask layer 204a and the second insulation layer 228 above the mask layer 204a is removed, to leave a second liner layer 212a.

Figure 2G:
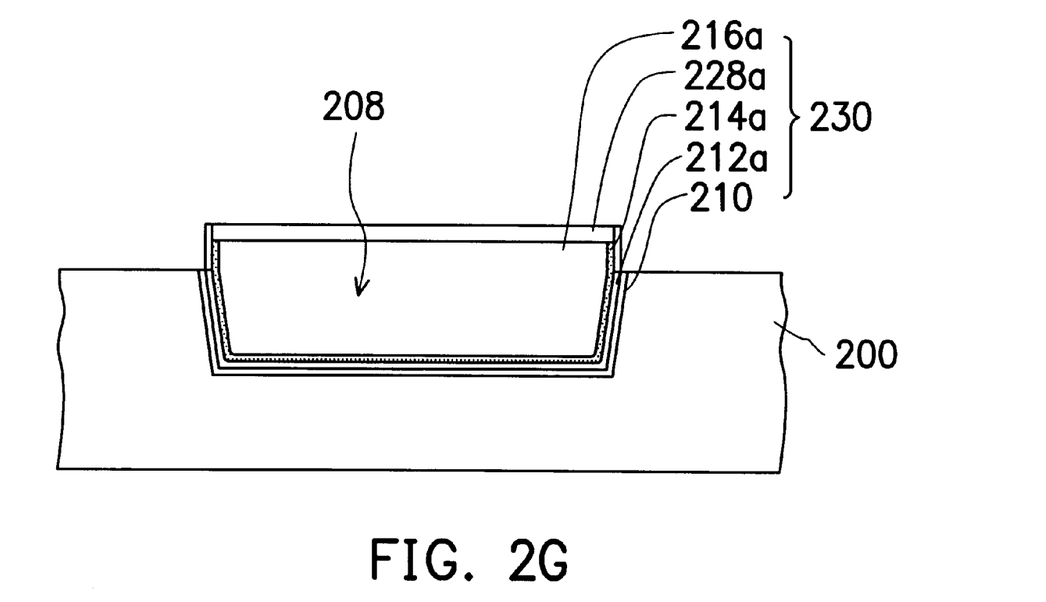

As shown in FIG. 2G, the mask layer 204a and the pad oxide layer 202a are sequentially removed. Hence, an isolation region 230 composed of the insulation layers 228a and 216a, the buffer layer 214a and the liner layers 212a and 210 within the trench 208 are formed. The method of removing the mask layer 204a includes using an isotropic etching operation such as a wet etching method. If the mask layer 204a is a silicon nitride layer, hot phosphoric acid solution is preferably used as an etchant in the wet etching operation. The pad oxide layer 202a can also be removed using an isotropic etching method or an anisotropic etching method. For example, hydrofluoric acid solution can be used to remove the pad oxide layer 202a in a wet etching operation. Alternatively, dry plasma can be used to etch away the pad oxide layer 202a anisotropically. The second liner layer 212a prevents the buffer layer 214a from being etched during the step of removing the mask layer 204a by the wet etching. The formation of the recess cavities at the top corners of the trench 208 is avoided while the mask layer 204a is etched by a conventional method is avoided. Furthermore, recess formed on the insulation layer 216a while the pad oxide layer 202a is removed by the etching is also improved. Thus, a polysilicon residue is prevented from being left within the recess, so that a bridging effect between gates formed in the following process is suppressed.

Since the densification of the second insulation layer 228 and the insulation layer 216a is carried out in an oxygen-filled atmosphere, the insulation layers are very compact. Therefore, when hydrofluoric acid solution is applied to remove the pad oxide layer 202a in a wet etching operation, difference in etching speed between the pad oxide layer 202a and the insulation layer 228a is greatly reduced. Consequently, recess cavities do not form in the insulation layer 228a at the top corners 220 of the trench 208. Hence, the kink effect that often occurs in conventional device is avoided. In addition, the buffer layer 214a surrounding the insulation layer 228a and the insulation layer 216a has an etching rate quite different from the etching rate of the pad oxide layer 202a and the insulation layer 228a. Therefore, when hydrofluoric acid solution is applied for the removal of the pad oxide layer 202a in a wet etching operation, the buffer layer 214a is capable of preventing the sideways etching of trench sidewalls. Hence, recess cavities do not form in the insulation layer 216a at the top corners 220 of the trench 208. Again, the kink effect is avoided.

FIGS. 3A through 3G are schematic, cross-sectional views showing the progression of manufacturing steps for forming a shallow trench isolation region in a substrate according to a second embodiment of this invention.

Figure 3A:
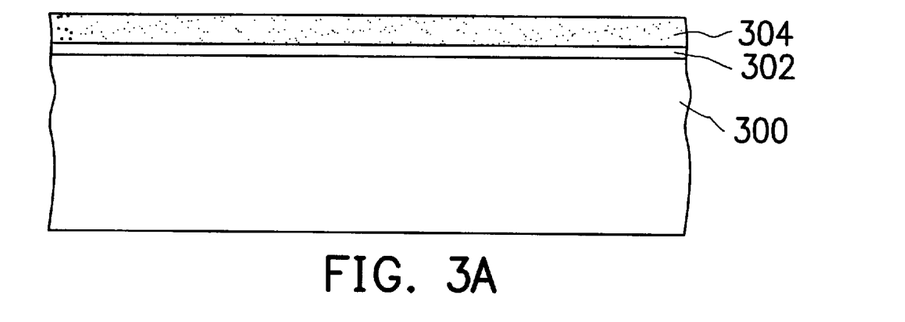
FIGS. 3A through 3G are schematic, cross-sectional views showing the progression of manufacturing steps for forming shallow trench isolation region in a substrate according to a second embodiment of this invention.

As shown in FIG. 3A, a pad oxide layer 302 is formed over a substrate 300, for example, a P-type silicon substrate. The pad oxide layer 302 can be formed using a thermal oxidation method. The pad oxide layer 302 protects the substrate against damages while subsequent processing operations are carried out. Thereafter, a mask layer 304 is formed over the pad oxide layer 302. The mask layer 304 is formed from a material having an etching rate that differs from the etching rate of the substrate 300. When the substrate 300 is a silicon layer, the mask layer 304 is preferably a silicon nitride layer formed using a chemical vapor deposition (CVD) method.

Figure 3B:
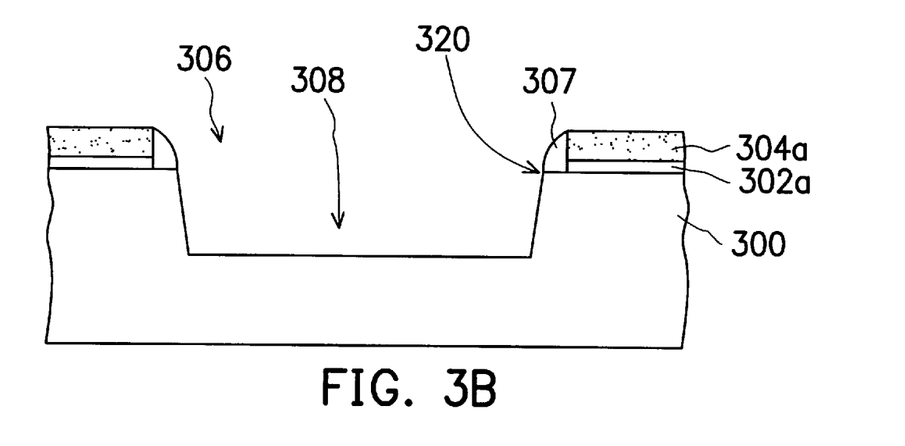

As shown in FIG. 3B, the mask layer 304 and the pad oxide layer 302 are patterned to form a mask layer 304a and a pad oxide layer 302a, both having an opening 306. Thereafter, spacers 307 are formed on the exposed sidewalls of the mask layer 304a and the pad oxide layer 302a. After that, the substrate 300 is etched to form a trench 308 using the mask layer 304a and the spacers 307 as a hard mask. The method of patterning the mask layer 304 and the pad oxide layer 302 includes forming a patterned photoresist layer (not shown) over the mask layer 304. Then, the mask layer 304 and the pad oxide layer 302 are sequentially etched to form the mask layer 304a and the pad oxide layer 302a. The photoresist layer is removed.

The spacers 307 are formed from a material having an etching rate that differs from the mask layer 304a and the substrate 300. If the mask layer 304a is a silicon nitride layer and the substrate is silicon, the spacers 307 are preferably made from silicon oxide. The spacers 307 are formed, for example, by first depositing silicon oxide over the substrate 300 to form a silicon oxide layer using a chemical vapor deposition (CVD) method. Then, the silicon oxide layer is etched back using an anisotropic etching method to form the oxide spacers 307 on the exposed sidewalls of the mask layer 304a and the pad oxide layer 302a.

Figure 3C:
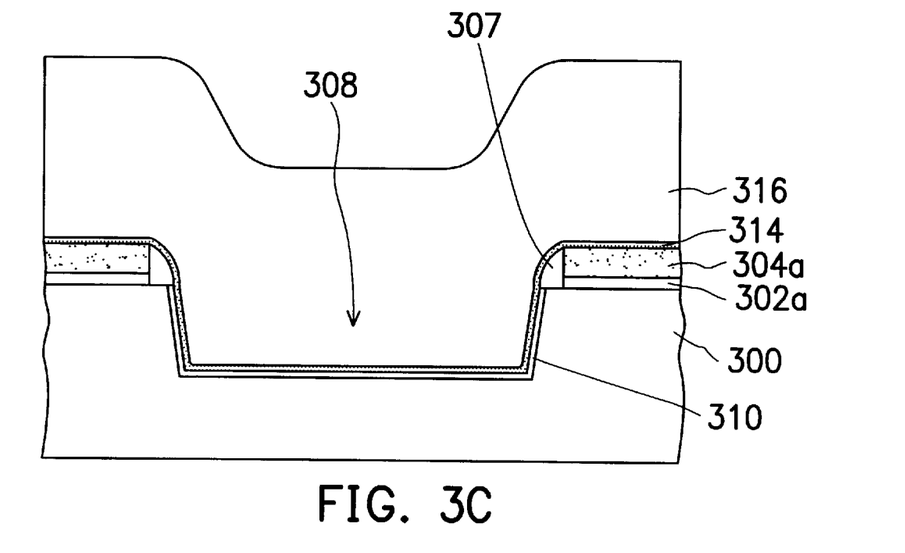

As shown in FIG. 3C, an oxidation process is carried out to form a liner layer 310 over the exposed substrate surface inside the trench 308. Thereafter, a buffer layer 314 conformal to the device profile is formed over the substrate.

Subsequently, a first insulating layer 316 that fills the trench 308 and the opening 306 is formed over the buffer layer 314. Normally, the oxidation process is carried out in an oxygen-filled chamber at a high temperature to form the liner layer 310 over the exposed interior surface of the trench 308. The buffer layer 314 is formed from a material having an etching rate that differs from the first insulation layer 316 and the pad oxide layer 302a. Thus, the buffer layer 314 is capable of preventing oxidation on the sidewall of the trench 308 when densification of the first insulation layer 316 is carried out. Furthermore, the buffer layer 314 is also capable of preventing the conventional kink effect caused by the sideways etching of the first insulation layer 316 in a subsequent operation. The first insulation layer 316 can be a TEOS silicon oxide layer formed using TEOS as a gaseous reactant in an atmospheric pressure chemical vapor deposition (APCVD) operation.

Figure 3D:
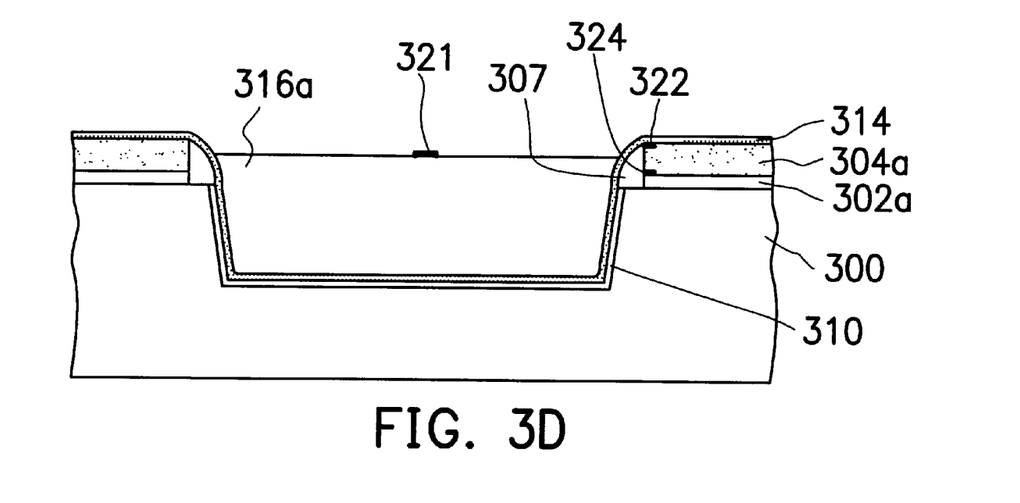

As shown in FIG. 3D, a portion of the first insulation layer 316 is removed to form an insulation layer 316a within the opening 306 and the trench 308 (FIG. 3C). The upper surface 321 of the insulation layer 316a is at a level between the upper surface 322 and the lower surface 324 of the mask layer 304a. The insulation layer 316a is formed, for example, by first performing a chemical-mechanical polishing operation to remove the first insulation layer 316 above the buffer layer 314 using the buffer layer 314 as a polishing stop layer. Then, the first insulation layer 316 is further etched back so that its upper surface 321 is at a level between the upper surface 322 and the lower surface 324 of the mask layer 304a.

Figure 3E:
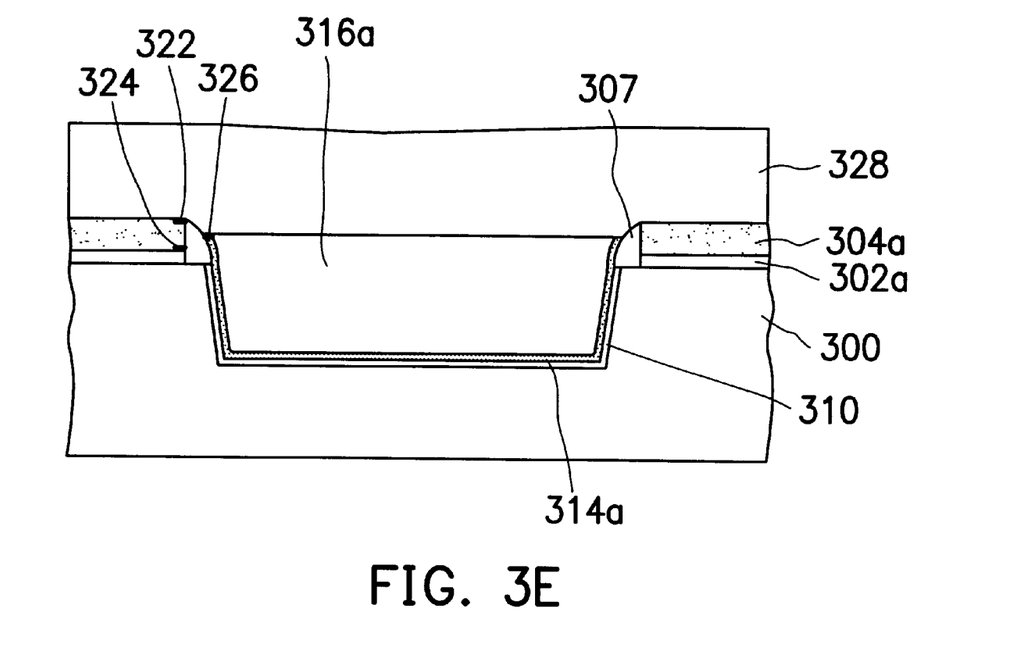

As shown in FIG. 3E, the exposed buffer layer 314 above the mask layer 304a is removed. Ultimately, the upper end of the remaining buffer layer 314a is at a level between the upper surface 322 and the lower surface 324 of the mask layer 304a. A second insulation layer 328 is formed over the substrate 300 and covers the mask layer 304a and the insulation layer 316a. The method for removing the buffer layer 314 includes an isotropic etching method such as wet etching. If the buffer layer 314 is a silicon nitride layer, hot phosphoric acid solution is preferably used as an etchant in the wet etching operation. The second insulation layer 328 is preferably a TEOS silicon oxide layer formed using TEOS as a gaseous reactant in an atmospheric chemical vapor deposition (APCVD) method.

Furthermore, it is preferable to densify the first insulation layer 316a and the second insulation layer 328. The insulation layers 316a and 328 can be densified by placing the substrate 300 in an oxygen-filled chamber and then heating to a temperature of about 1000° C. for about 10 to 30 minutes. Since an insulation layer densified in an oxygen-filled atmosphere is much denser than one densified in a nitrogen-filled atmosphere, the degree of isolation produced by these insulation layers 316a and 328 inside the isolating structure will be better. In addition, the buffer layer 314a between the substrate 300 and the insulation layer 316a can prevent the diffusion of oxygen during densification, and hence oxidation of the trench 308 sidewall is avoided.

Figure 3F:
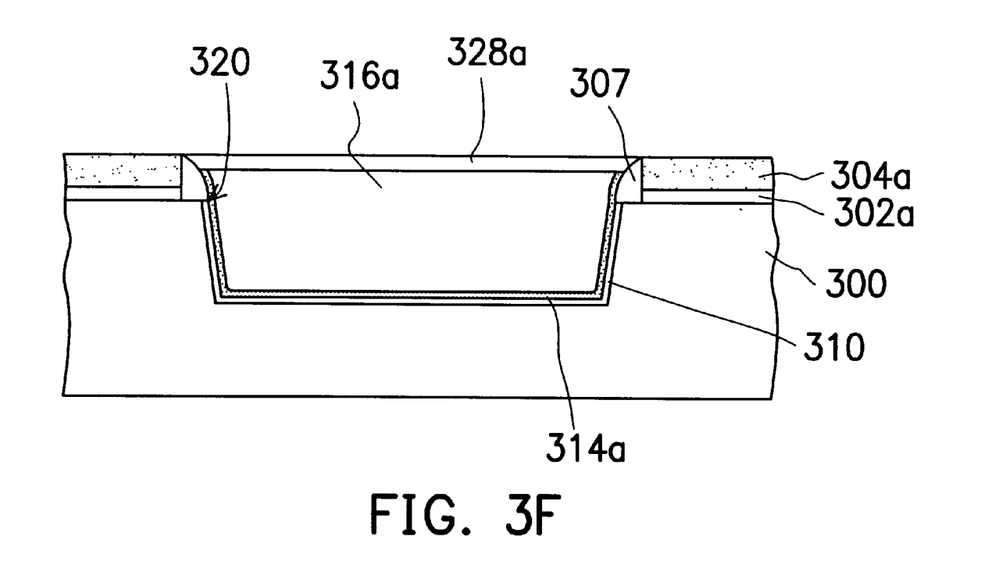

As shown in FIG. 3F, a portion of the second insulation layer 328 is removed using the mask layer 304a as a stop layer. The remaining second insulation layer 328 forms an insulation layer 328a that covers the insulation layer 316a and fills the opening 306 (FIG. 3B). The method of forming the insulation layer 328a includes performing a chemical-mechanical polishing operation using the mask layer 304a as a polishing stop layer. Therefore, the second insulation layer 328 above the mask layer 304a is removed.

Figure 3G:
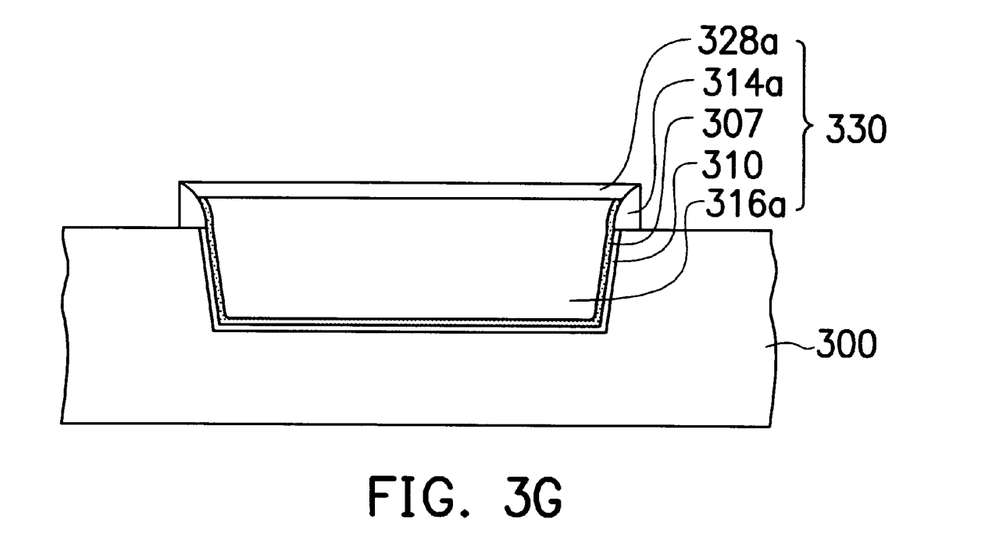

As shown in FIG. 3G, the mask layer 304a and the pad oxide layer 302a are sequentially removed. Hence, an isolation region 330 composed of the spacers 307, the insulation layers 328a and 316a, the buffer layer 314a and the liner layer 310 within the trench 308 are formed. The method of removing the mask layer 304a includes an isotropic etching operation such as a wet etching method. If the mask layer 304a is a silicon nitride layer, hot phosphoric acid solution is preferably used as an etchant in the wet etching operation. The pad oxide layer 302a can also be removed using an isotropic etching method or an anisotropic etching method. For example, hydrofluoric acid solution can be used for removing the pad oxide layer 302a in a wet etching operation. Alternatively, dry plasma can be used to etch away the pad oxide layer 302a anisotropically.

Since the densification of the second insulation layer 328 and the insulation layer 316a is carried out in an oxygen-filled atmosphere, the insulation layers are very compact. Therefore, when hydrofluoric acid solution is applied for the removal of the pad oxide layer 302a in a wet etching operation, the difference in etching speed between the pad oxide layer 302a and the insulation layer 328a is greatly reduced. Consequently, recess cavities do not form in the insulation layer 328a at the top corners 320 of the trench 308. Hence, the kink effect is avoided. In addition, the spacers 307 remain at the upper corners 320 of the trench 308 after the mask layer 304a is removed. Hence, when the pad oxide layer 302a is etched isotropically in a wet etching operation, the spacers 307 are able to provide an additional etching path which prevents the formation of recess cavities at the upper corners 320. Hence, the kink effect is avoided again. Furthermore, the buffer layer 314a surrounding the insulation layer 328a and the insulation layer 316a has an etching rate quite different from the pad oxide layer 302a and the insulation layer 328a. Therefore, when hydrofluoric acid solution is applied to remove the pad oxide layer 302a in a wet etching operation, the buffer layer 314a is capable of preventing the sideways etching of trench 308 sidewalls. Hence, recess cavities do not form in the insulation layer 316a at the top corners 320 of the trench 308. Again, the kink effect is avoided, and a polysilicon residue is prevented from being left within the recess, so that a bridging effect between gates formed in the following process is suppressed.

In summary, major advantages of carrying out the steps for forming shallow trench isolation region according to this invention includes:

1. The method can prevent the formation of recess cavities in the insulation layer near the upper corner of the trench. Hence, the kink effect is avoided.

2. The insulation layer within the trench formed using the invention has a higher density than the one formed by a conventional method.

3. The method is able to prevent the oxidation of trench sidewalls even when the insulation layer is densified in an oxygen-filled atmosphere.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming shallow trench isolation region, comprising the steps of:

providing a substrate;

forming a pad oxide layer over the substrate;

forming a mask layer over the pad oxide layer;

patterning the mask layer and the pad oxide layer to form an opening;

forming a trench in the substrate using the mask layer as a hard mask;

oxidizing the exposed substrate surface of the trench to form a first liner layer;

forming a second liner layer conformal to the surface profile of the substrate;

forming a buffer layer conformal to the surface profile of the substrate;

forming a first insulation layer within the trench and the opening such that the upper surface of the first insulation layer is at a level between the upper surface and the lower surface of the mask layer;

removing a portion of the buffer layer that covers the second liner layer so that the upper ends of the buffer layer is at a level between the upper surface and the lower surface of the mask layer;

forming a second insulation layer that fills the opening over the first insulation layer;

removing a portion of the second liner layer above the mask layer;

removing the mask layer; and removing the pad oxide layer.

2. The method of claim 1, wherein the step of forming the second liner layer includes performing a chemical vapor deposition operation.

3. The method of claim 2, wherein the step of forming the second liner layer includes using tetra-ethyl-ortho-silicate (TEOS) as a gaseous reactant.

4. The method of claim 1, wherein the buffer layer and the pad oxide layer are formed from materials having different etching rates so that oxidation of trench sidewalls can be prevented.

5. The method of claim 4, wherein the step of forming the buffer layer includes depositing silicon nitride.

6. The method of claim 5, wherein the step of forming the buffer layer includes performing a chemical vapor deposition operation.

7. The method of claim 1, wherein the step of forming the first insulation layer within the trench and the opening includes the substeps of:

depositing insulation material that fills the trench and the opening over the buffer layer;

removing a portion of the insulation layer by carrying out a chemical-mechanical polishing operation using the buffer layer as a polishing stop layer; and etching back the insulation layer to form a first insulation layer inside the opening and the trench so that its upper surface is at a level between the upper surface and the lower surface of the mask layer.

8. The method of claim 7, wherein the step of depositing the insulation material includes depositing silicon oxide.

9. The method of claim 8, wherein after the step of forming the second insulation layer over the first insulation layer but before the step of removing the first mask layer, further includes densifying the first insulation layer and the second insulation layer in an oxygen-filled atmosphere.

10. The method of claim 1, wherein the step of forming the second insulation layer over the first insulation layer and the step of removing a portion of the second liner layer above the mask layer includes the substeps of:

depositing insulation material into the opening and over the second liner layer; and removing a portion of the insulation layer and a portion of the second liner layer by a chemical-mechanical polishing operation using the mask layer as a polishing stop layer so that the insulation material inside the opening forms a second insulation layer.

11. The method of claim 10, wherein the step of forming the step of depositing insulation material into the opening and over the second liner layer includes depositing silicon oxide.

12. The method of claim 11, wherein after the step of forming the second insulation layer over the first insulation layer but before the step of removing the mask layer, further includes densifying the first insulation layer and the second insulation layer in an oxygen-filled atmosphere.

13. The method of claim 1, wherein the step of removing a portion of the buffer layer above the second liner layer includes an isotropic etching method.

14. The method of claim 13, wherein the step of removing a portion of the buffer layer above the second liner layer includes wet etching.

15. A method for forming shallow trench isolation region, comprising the steps of:

providing a substrate;

forming a pad oxide layer over the substrate;

forming a mask layer over the pad oxide layer;

patterning the mask layer and the pad oxide layer to form an opening;

forming spacers on the exposed sidewalls of the mask layer and the pad oxide layer;

forming a trench in the substrate using the mask layer and the sidewall spacers as a hard mask;

oxidizing the exposed substrate surface of the trench to form a liner layer;

forming a buffer layer conformal to the surface profile of the substrate;

forming a first insulation layer within the trench and the opening such that the upper surface of the first insulation layer is at a level between the upper surface and the lower surface of the mask layer;

removing a portion of the buffer layer that covers the liner layer so that the upper ends of the buffer layer are at a level between the upper surface and the lower surface of the mask layer;

forming a second insulation layer that fills the opening over the first insulation layer;

removing the mask layer; and removing the pad oxide layer.

16. The method of claim 15, wherein the step of forming the spacers includes the substeps of:

forming a silicon oxide layer over the substrate; and etching back the silicon oxide layer so that silicon oxide spacers are formed on the exposed sidewalls of the mask layer and the pad oxide layer.

17. The method of claim 15, wherein the buffer layer and the pad oxide layer are formed from materials having different etching rates so that oxidation of trench sidewalls can be prevented.

18. The method of claim 17, wherein the step of forming the buffer layer includes depositing silicon nitride.

19. The method of claim 18, wherein the step of forming the buffer layer includes performing a chemical vapor deposition operation.

20. The method of claim 15, wherein the step of forming the first insulation layer within the trench and the opening includes the substeps of:

depositing insulation material that fills the trench and the opening over the buffer layer;

removing a portion of the insulation layer by carrying out a chemical-mechanical polishing operation using the buffer layer as a polishing stop layer; and etching back the insulation layer to form a first insulation layer inside the opening and the trench so that its upper surface is at a level between the upper surface and the lower surface of the mask layer.

21. The method of claim 20, wherein the step of depositing the insulation material includes depositing silicon oxide.

22. The method of claim 21, wherein after the step of forming the second insulation layer over the first insulation layer but before the step of removing the first mask layer, further includes densifying the first insulation layer and the second insulation layer in an oxygen-filled atmosphere.

23. The method of claim 15, wherein the step of forming the second insulation layer over the first insulation layer includes the substeps of:

depositing insulation material into the opening and over the mask layer; and removing a portion of the insulation layer by a chemical-mechanical polishing operation using the mask layer as a polishing stop layer so that the insulation material inside the opening forms a second insulation layer.

24. The method of claim 23, wherein the step of forming the step of depositing insulation material into the opening and over the mask layer includes depositing silicon oxide.

25. The method of claim 24, wherein after the step of forming the second insulation layer over the first insulation layer but before the step of removing the mask layer, further includes densifying the first insulation layer and the second insulation layer in an oxygen-filled atmosphere.

26. The method of claim 15, wherein the step of removing a portion of the buffer layer above the mask layer includes an isotropic etching method.

27. The method of claim 26, wherein the step of removing a portion of the buffer layer above the mask layer includes a wet etching method.

* * * * *